United States Patent
Yamabayashi et al.

(10) Patent No.: US 8,173,094 B2
(45) Date of Patent: May 8, 2012

(54) METHOD FOR PRODUCING POLYCRYSTALLINE SILICON

(75) Inventors: Toshiharu Yamabayashi, Tsukuba (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 352 days.

(21) Appl. No.: 12/159,066

(22) PCT Filed: Dec. 26, 2006

(86) PCT No.: PCT/JP2006/326358
§ 371 (c)(1),
(2), (4) Date: Jun. 24, 2008

(87) PCT Pub. No.: WO2007/077957
PCT Pub. Date: Jul. 12, 2007

(65) Prior Publication Data
US 2009/0136409 A1   May 28, 2009

(30) Foreign Application Priority Data

Dec. 27, 2005 (JP) ............................. 2005-374252
May 29, 2006 (JP) ............................. 2006-147729

(51) Int. Cl.
*C01B 33/02* (2006.01)
*C01F 3/00* (2006.01)
*C01F 7/48* (2006.01)
*C01G 15/00* (2006.01)

(52) U.S. Cl. ............... 423/350; 423/348; 423/495

(58) Field of Classification Search ......... 423/348–350, 423/495
See application file for complete search history.

(56) References Cited

U.S. PATENT DOCUMENTS

| 3,252,823 A | * | 5/1966 | Jacobson et al. ............ 427/213 |
| 4,225,367 A | * | 9/1980 | Anglerot ...................... 438/97 |
| 4,312,850 A | * | 1/1982 | Dietl et al. ................... 423/350 |
| 4,525,334 A | | 6/1985 | Woditsch et al. |
| 4,919,912 A | | 4/1990 | Taggart et al. |
| 4,919,913 A | | 4/1990 | Kurz et al. |

FOREIGN PATENT DOCUMENTS

| JP | 36-8416 A | 6/1961 |
| JP | 54-84825 A | 7/1979 |
| JP | 60-103016 A | 6/1985 |
| JP | 2-64006 A | 3/1990 |
| JP | 11011925 A | * 1/1999 |

(Continued)

OTHER PUBLICATIONS

Banerjee et al. "On the Growth Morphology of Solar-Grade Polysilicon Prepared by Zinc Reduction of Silicon Tetrachloride", Materials Letters, vol. 2, No. 4A. Mar. 1984. pp. 265.*

(Continued)

*Primary Examiner* — Stanley Silverman
*Assistant Examiner* — Anthony J Zimmer
(74) *Attorney, Agent, or Firm* — Birch, Stewart, Kolasch & Birch, LLP

(57) ABSTRACT

The present invention provides a method for producing polycrystalline silicon. The method for producing polycrystalline silicon comprises the steps of (A), (B), and (C),
(A) reducing a chlorosilane represented by the formula (1) with a metal at a temperature T1 to obtain a silicon compound;

$$SiH_nCl_{4-n} \quad (1)$$

wherein n is an integer of 0 to 3,
(B) transferring the silicon compound to a zone having a temperature T2, wherein T1>T2; and
(C) depositing polycrystalline silicon in the zone having a temperature T2,
wherein the temperature T1 is not less than 1.29 times of a melting point (Kelvin unit) of the metal, and the temperature T2 is higher than a sublimation point or boiling point of the chloride of the metal.

7 Claims, 8 Drawing Sheets

FOREIGN PATENT DOCUMENTS

JP 2005-279663 A 10/2005
WO WO 2004035472 A1 * 4/2004

OTHER PUBLICATIONS

Yoshizawa et al., "Reduction of Silicon Tetrachloride by Aluminum," *Industrial Chemistry Journal*, vol. 64, No. 8, 1961, pp. 1347-1350.

Chinese Office Action issued on Jun. 12, 2010 in Chinese Patent Application No. 200680049174.0 with English translation.
Chinese Office Action issued on Mar. 30, 2011 in Chinese Patent Application No. 200680049174.0 with English translation.
Japanese Office Action for corresponding Japanese Patent Application No. 2006-349248, dated Aug. 9, 2011.

* cited by examiner

METHOD FOR PRODUCING POLYCRYSTALLINE SILICON

TECHNICAL FIELD

The present invention relates to a method for producing polycrystalline silicon.

BACKGROUND ART

An environmental problem has come to the fore and a solar cell is noted as a clean energy source. The demand of a solar cell is sharply increasing on residential purposes also in our country. A silicon-based solar cell is excellent in reliability and cell efficiency, and the silicon-based solar cell makes up about 80% of photovoltaic system. In order to increase the demand and decrease power generation cost, it is required to obtain a silicon material with low cost. At present as for a method for producing high purity silicon, most makers use Siemens method in which trichlorosilane is thermally decomposed. However, this method has a limit in electric power consumption rate, and it is hard to further decrease the cost.

As a method instead of a thermal decomposition, a method of reducing chlorosilane using zinc or aluminum to obtain silicon is proposed. For example, a method for producing silicon, in which fine aluminum particles are reacted with silicon tetrachloride gas, is known.

JP-A-2-64006 (U.S. Pat. No. 4,919,913) discloses a method for producing silicon, in which a gaseous silicon compound represented by a formula of $SiH_nX_{4-n}$ (wherein X is halogen and n is from 0 to 3) is reacted with aluminum. In this method, the gaseous silicon compound is contacted with a molten metal surface in which pure aluminum or Al—Si alloy is finely dispersed.

JP-A-60-103016 discloses a method for producing pure silicon, which includes the steps of suppylying silicon tetrachloride gas to a silicon alloy or a silicon copper alloy with a high silicon content at a high temperature to generate a gas, cooling the gas appropriately and deposit a partial amount of silicon so as to make impurities to be absorbed in the deposited part of silicon, and then cooling the gas.

Further, JP-B-36-8416 discloses a method of reducing silicon tetrachloride with aluminum which is evaporated at a high temperature.

DISCLOSURE OF THE INVENTION

An objective of the present invention is to provide a method for producing high purity polycrystalline silicon by efficiently reducing chlorosilane with a metal.

The present inventors have intensively studied a method for producing polycrystalline silicon, resultantly leading to completion of the present invention.

That is, the present invention provides as follows:
[1] A method for producing polycrystalline silicon comprising the steps of (A), (B) and (C),
 (A) reducing a chlorosilane represented by the formula (1) with a metal at a temperature T1 to obtain a silicon compound, $$SiH_nCl_{4-n} \quad (1)$$

wherein n is an integer of 0 to 3,
 (B) transferring the silicon compound to a zone having a temperature T2, wherein T1>T2, and
 (C) depositing polycrystalline silicon in the zone having a temperature T2, wherein the temperature T1 is not less than 1.29 times of the melting point (Kelvin unit) of the metal, and the temperature T2 is higher than a sublimation point or boiling point of the chloride of the metal.
[2] The method according to [1], further comprising the step of (D),
 (D) purifying the polycrystalline silicon obtained in the step (C),
[3] The method according to [1] or [2], wherein a material is chlorosilane gas or a mixed gas of chlorosilane and an inert gas.
[4] The method according to [3], wherein the material has a chlorosilane content of not less than 10% by volume.
[5] The method according to [1] or [2], wherein chlorosilane is at least one selected from silicon tetrachloride, trichlorosilane, dichlorosilane, and monochlorosilane.
[6] The method according to [1] or [2], wherein the metal is at least one selected from potassium, cesium, rubidium, strontium, lithium, sodium, magnesium, aluminum, zinc, and manganese.
[7] The method according to [6], wherein the metal is aluminum.
[8] The method according to [7], wherein aluminum has a purity of not less than 99.9% by weight, which is represented by the following formula, purity (% by weight) 100−(Fe+Cu+Ga+Ti+Ni+Na+Mg+Zn)

wherein Fe, Cu, Ga, Ti, Ni, Na, Mg, and Zn represent the contents (% by weight) of iron, copper, gallium, titanium, nickel, sodium, magnesium, and zinc respectively.
[9] The method according to [1] or [2], wherein a gas flow rate in a zone at the temperature T2 is from not less than 0.62 m/min to less than 1000 m/min.
[10] A solar cell comprising polycrystalline silicon obtained by the method according to [1] or [2].

Further, the present invention provides an apparatus comprising the following (1) to (7),
 (1) a reactor for reducing chlorosilane with a metal,
 (2) a heater for heating gas in the reactor,
 (3) a feeder for introducing chlorosilane as a raw material into the reactor,
 (4) a deposition vessel for depositing polycrystalline silicon,
 (5) a transfer unit for introducing the gas generated in the reactor into a deposition zone,
 (6) a cooler for controlling a flow rate of gas transferred to a deposition zone and cooling the gas,
 (7) a temperature controller for making a temperature T1 of gas in the container to be not less than 1.29 times of the melting point (Kelvin unit) of a metal, keeping a temperature of gas during transferring it, and making a temperature T2 of gas at a deposition zone to be higher than the sublimation point or boiling point of the chloride of the metal.

EXPLANATION OF REFERENCE NUMERALS

Figure 1:
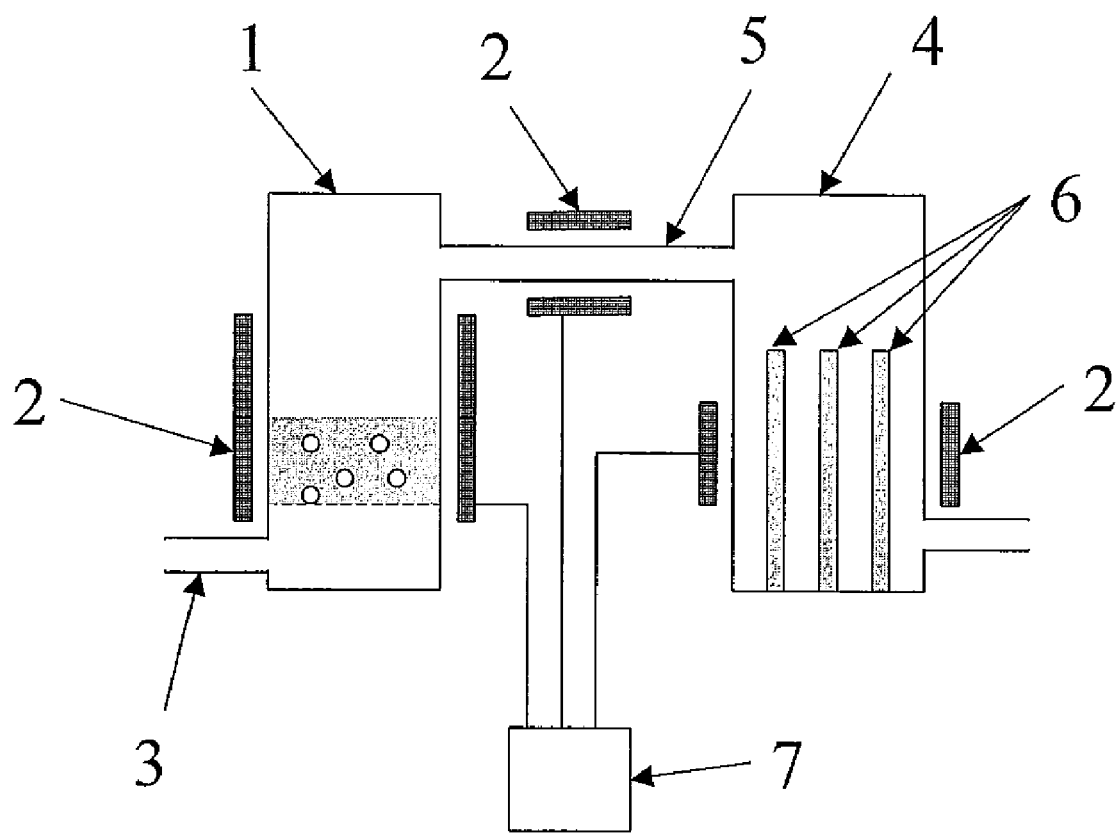
FIG. 1 shows a first embodiment of apparatus of the present invention.

1: Reactor
2: Heater
3: Feeder
4: Deposition vessel
5: Transfer unit
6: Cooler
7: Temperature controller
11: Heater (vertical circular furnace)
12: Piping (gas pipe)
13: Alumina container
14: Reactor (alumina protecting tube)
15: Molten aluminum
16: $SiCl_4$/Ar, reaction gas
17: 1273K temperature zone
18: Alumina container cap
19: 773K temperature zone

MODES FOR CARRYING OUT OF THE INVENTION

Step (A): Reduction

A method for producing polycrystalline silicon of the present invention includes the above described step (A).

A raw material used in the step (A) is chlorosilane represented by the above formula (1), includes silicon tetrachloride, trichlorosilane, dichlorosilane, and monochlorosilane. These may be used independently or in combination. Among these materials, chlorosilane containing hydrogen (trichlorosilane, dichlorosilane, and monochlorosilane) generates hydrogen chloride due to reduction reaction, and thus may induce corrosion of a reactor or a piping. From the viewpoint of preventing corrosion, chlorosilane is preferably silicon tetrachloride. It is preferable that chlorosilane has a boron content of less than 1 ppm, a phosphorus content of less than 1 ppm and a purity of not less than 99.99, since impurities tend to be accumulated in silicon obtained by reduction. A material may be only chlorosilane, or a mixture of chlorosilane and inert gas. Examples of the inert gas include nitrogen, argon, helium, and neon, preferably argon. When the material is the mixture of chlorosilane and the inert gas, the mixture has a chlorosilane content of preferably not less than 10% by volume from viewpoint of improving reaction efficiency and silicon yield in a short time.

The metal is a metal that can reduce chlorosilane. At a temperature T1 described below, a free energy of formation of chloride of the metal is lower than that of silicon. The metal has preferably a lower melting point than that of silicon. Examples of the metal include potassium, cesium, rubidium, strontium, lithium, sodium, magnesium, aluminum, zinc, and manganese, preferably aluminum. These may be used independently or by combining those. If aluminum is remained in silicon obtained or on the surface of the silicon, it can be easily removed by dissolution using acid or alkali or segregation, and does not corrode structural members of the reactor. Aluminum has preferably a purity of not less than 99.9% by weight. The purity of aluminum in the description is calculated by the following formula.

Purity (% by weight)=100−(Fe+Cu+Ga+Ti+Ni+Na+Mg+Zn)

In this formula, Fe, Cu, Ga, Ti, Ni, Na, Mg, and Zn represent the contents (% by weight) of iron, copper, gallium, titanium, nickel, sodium, magnesium, and zinc, respectively. Further, aluminum has preferably a boron content of not more than 5 ppm, and a phosphorus content of not more than 0.5 ppm.

Reduction may be carried out at the following conditions of a temperature T1 and a pressure.

T1 is not less than 1.29 times of the melting point of the metal, preferably not less than 1.33 times, and more preferably not less than 1.41 times, and less than 2.33 times, more preferably less than 2.11 times, and further preferably less than 1.90 times. When T1 is less than 1.29 times of the melting point, it takes much time for reduction. When T1 is not less than 2.33 times, there is no apparatus which can be used at such a high temperature, and thus it is hard to continuously carry out reduction. When the metal is aluminum, T1 is preferably not less than 1204K and less than 2173K, more preferably not less than 1241K and less than 1973K, and further preferably not less than 1316K and less than 1773K. In the description, T1 represents an absolute temperature (Kelvin unit) of the metal in the reactor.

A pressure is not less than 0.5 bar and less than 5.0 bar. When the pressure is less than 0.5 bar, reaction efficiency tends to be decreased. On the other hand, when the pressure is not less than 5.0 bar, an apparatus becomes large and complicated in structure for keeping the pressure in the reactor.

Reduction may be carried out, for example, by a method of introducing vaporized chlorosilane into molten metal, a method of spraying fine molten metal powder (for example, powder with an average particle diameter of not more than 200 μm) in a chlorosilane atmosphere at a temperature of not lower than the melting point of the metal and not higher than the melting point of silicon, or a method of charging metal fine powder into a fluidized bed and heating the powder at a temperature of not lower than the melting point of the metal while introducing chlorosilane.

The reduction is preferably carried out by the method of introducing vaporized chlorosilane into molten metal since the apparatus is simple in structure and silicon can be produced with a low cost.

In the step (A), chlorosilane (e.g., $SiCl_4$) may be reduced with metal so as to generate sub-halide (e.g., $SiCl_3$ or $SiCl_2$).

When reduction is carried out at a higher temperature, sub-halide of silicon is preferentially generated. Thus, reduction is preferably carried out at a high temperature from the viewpoint of producing high purity silicon. The generated sub-halide is changed into silicon and $SiCl_4$ at a low temperature zone such as a deposited zone described below. The obtained $SiCl_4$ may be recycled as a raw material.

Step (B): Transfer

A method for producing polycrystalline silicon of the present invention includes the above-described step (B).

In the step (B), a reaction gas obtained in the step (A) is transferred.

Transferring is carried out using a pressure difference which is generated between a reactor and a deposited zone of the step (C) described below. For example, reaction gas may be transferred from the reactor to the deposited zone by continuously feeding chlorosilane as a raw material to the reactor.

Reaction gas may be transferred using a device for transferring gas which is set up between the reactor and the deposited zone Step (C): Deposition The method for producing polycrystalline silicon of the present invention includes further the above-described step (C).

In the step (C), silicon is deposited from transferred reaction gas.

Deposition may be carried out at the following conditions of a temperature T2 and a gas flow rate.

T2 is lower than T1, and is preferably higher than the sublimation point or boiling point of metal chloride. More preferably, T2 is not less than 1.5 times of the sublimation point or boiling point (Kelvin unit) of the metal chlorides and further preferably not less than 2 times. When T2 is higher than the sublimation point or boiling point of the metal chloride, chloride and silicon tend not to deposit simultaneously. Thus, a step of separating chloride and silicon is not needed. For example, when the metal is aluminum, T2 is lower than T1, preferably higher than 453K, more preferably not less than 680K, and further preferably not less than 906K.

A gas flow rate is not less than 0.62 m/min and less than 1000 m/min as a normal gas flow rate at a fixed temperature of T1, preferably not less than 0.62 m/min and less than 100 m/min, and more preferably not less than 1.0 m/min and less than 20 m/min. When the gas flow rate is less than 0.62 m/min, the amount of deposited silicon may be decreased. When the gas flow rate is not less than 1000 m/min, a deposition zone of silicon is increased, and thus a deposition vessel with a large capacity is required.

Deposition may be carried out in the presence of a silicon seed crystal. When silicon is deposited in the presence of the seed crystal, a deposition zone of silicon is decreased, and thus a deposition vessel may be decreased in size. The deposition may be carried out in either a batch or a continuous way. For example, the deposition may be carried out by a fluidized bed method of depositing silicon on a silicon crystal, or a method using two deposition vessels, one vessel is used for deposition and deposited silicon is recovered from another vessel and these operations may be alternately carried out.

In the method of the present invention, metal chloride, which is generated as a by-product by reacting chlorosilane with a metal, and unreacted chlorosilane gas are separately recovered. The chlorosilane gas may be recycled as a raw material.

Step (D): Purification

The method for producing polycrystalline silicon of the present invention may further include the step (D).

(D) Purifying Polycrystalline Silicon Obtained in the Step (C)

Purification may be carried out by acid treatment, alkali treatment, segregation such as unidirectional solidification, or high vacuum melting, preferably unidirectional solidification. These may be used independently or in combination. Impurity elements may be removed from polycrystalline silicon due to the purification.

The obtained polycrystalline silicon has a high purity, and is suitably used for a material of silicon for a solar cell. A method for producing a solar cell using polycrystalline silicon will be illustrated below.

An ingot is obtained from polycrystalline silicon by casting or electromagnetic casting. The ingot is normally sliced with an inner circumferential blade, and both faces of the ingot are lapped using free abrasive grains to obtain a disk. The disk is dipped in an etchant (e.g., hydrofluoric acid) to remove a damaged layer, and then a polycrystalline substrate is obtained. To reduce light reflecting loss on the surface, the polycrystalline substrate is mechanically formed to have a V-shaped groove by using a dicing machine, or is formed to have a texture structure by a reactive ion etching or an isotropic etching using acid. Since the substrate is normally P-type conductive, a p-type dopant may be doped by, for example, doping boron to the substrate or remaining aluminum in the substrate. A p-n junction may be obtained by forming a diffusion layer doped with n-type dopant (e.g., phosphorus or arsenic) on a light receiving face. An oxide film layer (e.g., $TiO_2$) is formed on the surface of the substrate and electrodes are formed on each face of the substrate. Further, an antireflection coating (e.g., $MgF_2$) for reducing light energy loss by reflection may be formed so as to produce a solar cell.

Apparatus for Producing Polycrystalline Silicon

The apparatus of the present invention includes a reactor 1, a heater 2, a feeder 3, a deposition vessel 4, a transfer unit 5, a cooler 6, and a temperature controller 7.

The reactor 1 is a reactor in which chlorosilane represented by the above formula (1) can be reduced with metal such as potassium, cesium, rubidium, strontium, lithium, sodium, magnesium, aluminum, zinc, or manganese. The reactor 1 is made of a material substantially not reacted with a metal at a temperature T1. Examples of the material include oxides such as silica, alumina, zirconia, titania, zinc oxide, magnesia, and tin oxide; nitrides such as silicon nitride and aluminum nitride; or carbide such as silicon carbide. The material may be used in which a part of an element is partially replaced with other element. Examples of such material include sialon composed of silicon, aluminum, oxygen, and nitrogen, and graphite having a surface coating with silicon nitride or silicon carbide of a thickness of not more than 300 μm The reactor 1 may have a porous plate which supports a metal in the reactor 1. The porous plate may have a pore diameter same size as pore from which molten metal can not drop a high temperature because of its surface tension.

The heater 2 may heat a metal and gas in the reactor 1, and keeps a gas temperature in the reactor 1 being not less than 1.29 times of the melting point (Kelvin unit) of the metal. The heater 2 may heat the metal and gas in the reactor 1, or heat only chlorosilane fed as a raw material so as to heat the inside of the reactor 1.

The feeder 3 may introduce chlorosilane as a material into the reactor 1. Examples of the feeder 3 include a piping. The feeder 3 may be set on the side face of the reactor 1, and may feed chlorosilane onto a metal as a material in the reactor 1. Examples of material of the feeder 3 include oxides such as silica, alumina, zirconia, titania, zinc oxide, magnesia, and tin oxide; nitrides such as silicon nitride and aluminum nitride; or carbide such as silicon carbide. The material may be used in which a part of an element is partially replaced with other element. Examples of such material include sialon composed of silicon, aluminum, oxygen, and nitrogen, and graphite having a surface coating with silicon nitride or silicon carbide of a thickness of not more than 300 μm.

The deposition vessel 4 is used for depositing polycrystalline silicon. The deposition vessel 4 is made of a material substantially not reacted with silicon at a temperature T2. Examples of material of the deposition vessel 4 include oxides such as silica, alumina, zirconia, titania, zinc oxide, magnesia, and tin oxide; nitrides such as silicon nitride and aluminum nitride; or carbide such as silicon carbide. The material may be used in which a part of an element is partially replaced with other element. Examples of such material include sialon composed of silicon, aluminum, oxygen, and nitrogen, and graphite having a surface coating with silicon nitride or silicon carbide of a thickness of not more than 300 μm The transfer unit 5 may transfer the gas generated in the reactor 1 to the deposition vessel 4. Examples of the transfer unit 5 include a piping between the reactor 1 and the deposition vessel 4, a generator of pressure difference between an internal space of the reactor 1 and an internal space of the deposition vessel 4, a pressure control valve interposed between the reactor 1 and the deposition vessel 4 (for example, a piping), or a reducer for changing a piping diameter for controlling a gas flow rate. These may be used independently or in combination.

The cooler 6 may control a gas flow rate in the deposition vessel 4, cool the gas, and deposit silicon. Examples of the cooler 6 include a ceramics filter.

The temperature controller 7 sets the gas temperature T1 in the reactor 1 to be not less than 1.29 times of the melting point (Kelvin unit) of a metal, preferably not less than 1.33 times, more preferably not less than 1.41 times, and preferably less than 2.33 times, more preferably less than 2.11 times, and further preferably less than 1.90 times. The temperature controller 7 keeps the temperature of transferred gas, and makes the temperature T2 of the deposition vessel 4 to be higher than the sublimation point or boiling point of the chloride of the metal.

According to this apparatus, for example, the steps (A), (B) and (C) of the method for producing polycrystalline silicon may be easily carried out.

Embodiments of the apparatus will be illustrated with reference to FIG. 1.

In the apparatus shown in FIG. 1, a reactor 1 and a deposition vessel 4 are connected through a transfer unit 5. The reactor 1 is connected with a feeder 3, and a heater 2 is set at the outsides of the reactor 1 and the deposition vessel 4 and the transfer unit 5. A cooler 6 is set at the inside of the deposition vessel 4. The heater 2 is controlled in each zone by the temperature controller. In FIG. 1, a device to generate a pressure difference between an internal space of the reactor 1 and an internal space of the deposition vessel 4 (e.g., a blower) is omitted among transfer unit 5 for transferring reaction gas from the reactor 1 to the deposition vessel 4.

When polycrystalline silicon is produced using the apparatus shown in FIG. 1, a metal is charged into the reactor 1 and chlorosilane is introduced into the reactor 1 from the feeder 3. The metal is reacted with and chlorosilane at a temperature T1 in the reactor 1 and a generated reaction gas is introduced into the deposition vessel 4 through the transfer unit 5. The reaction gas is cooled at the temperature T2 by the cooler 6, and silicon is deposited from the reaction gas in the deposition vessel 4.

Figure 2:
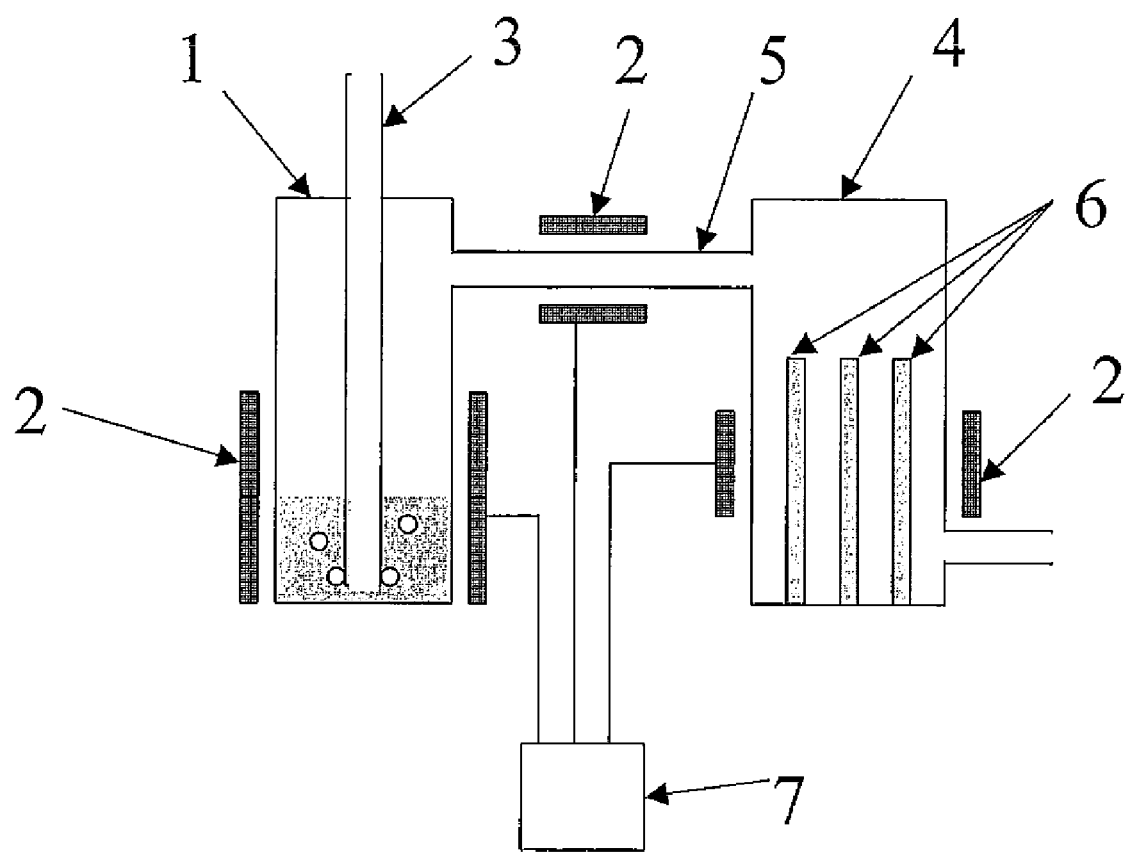
FIG. 2 shows a second embodiment of apparatus of the present invention.

The apparatus shown in FIG. 2 has a similar structure to the apparatus shown in FIG. 1 except the feeder 3 is inserted into the reactor 3 from an upper part thereof. Chlorosilane is transferred from an upper part to a lower part of the feeder 3 and contacted with a metal heated by the heater 2. The chlorosilane is reduced with the metal so as to generate a reaction gas. The chlorosilane gas passes through the heated feeder 3 and is heated.

Figure 3:
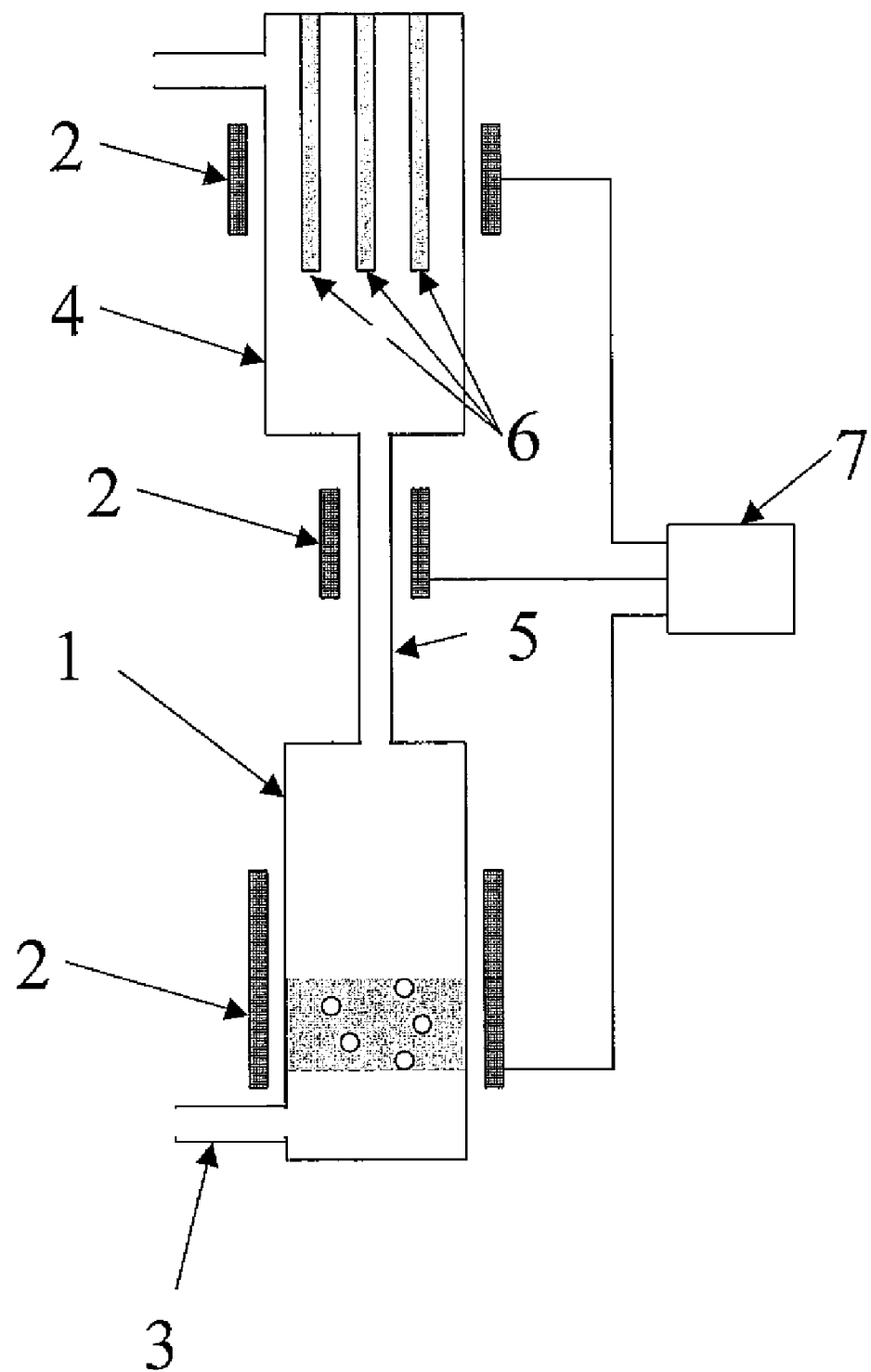
FIG. 3 shows a third embodiment of apparatus of the present invention.

The apparatus shown in FIG. 3 has a vertical structure and includes a deposition vessel 4 on the upper part of a reactor 1. These are connected through a transfer unit 5. Like the apparatus shown in FIG. 1, the reactor 1 is connected with a feeder 3, and a heater 2 is set at the outsides of the reactor 1 and the deposition vessel 4 and the transfer unit 5. A cooler 6 is set at the inside of the deposition vessel 4. The heater 2, the transfer unit 5 and the cooler 6 are respectively controlled to keep a predetermined gas temperature and a deposition temperature according to kinds of the metal and chlorosilane by the temperature controller 7.

Figure 4:
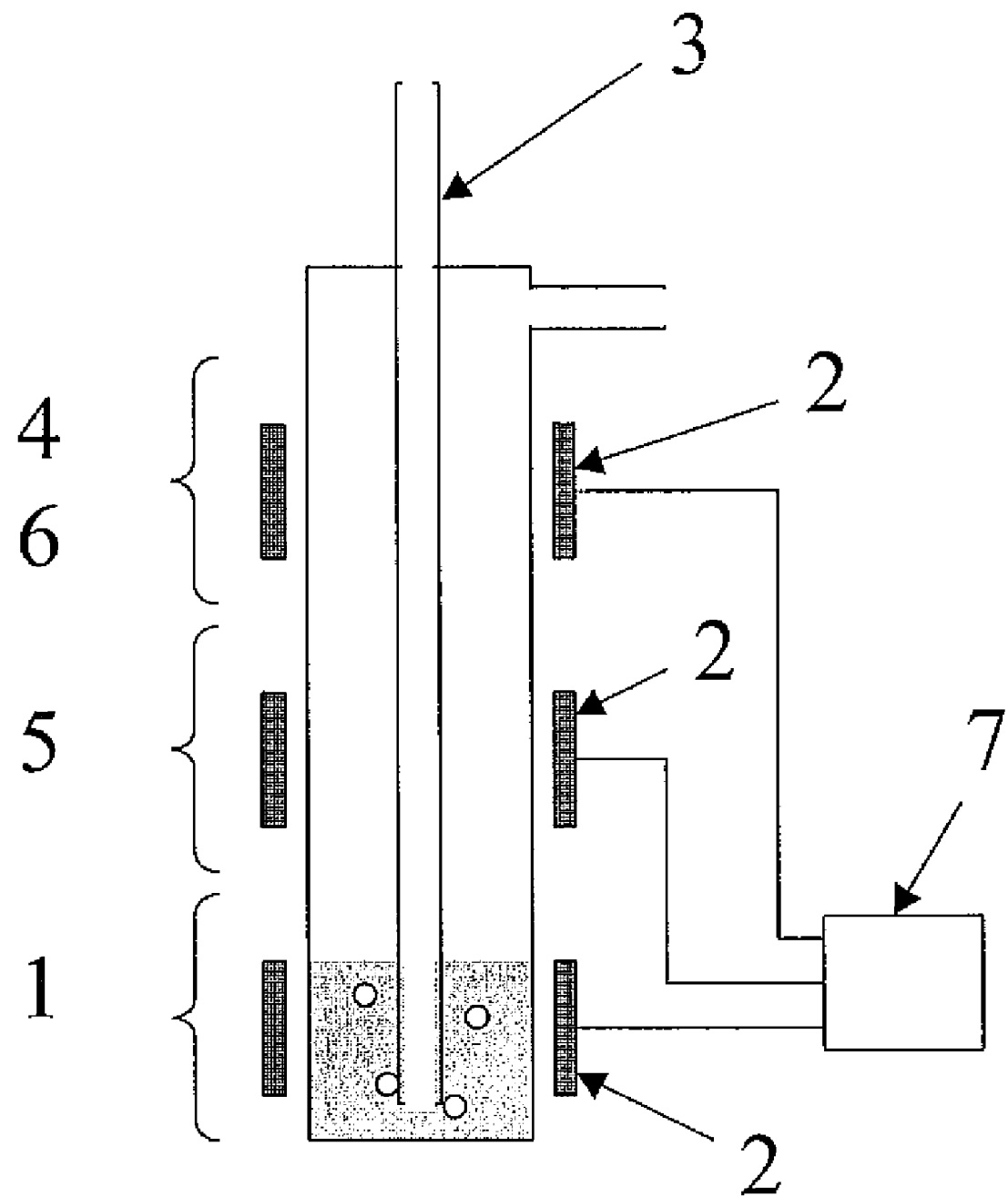
FIG. 4 shows a fourth embodiment of apparatus of the present invention.

The apparatus shown in FIG. 4 includes a reactor 1, a transfer unit 5, and a deposition vessel 4, in which those have the same cross section and are integrated. When polycrystalline silicon is produced using the apparatus shown in FIG. 4, a metal is charged into the reactor 1, chlorosilane is transferred from an upper part to a lower part through the feeder 3 and contacted with the metal heated by a heater 2. The metal and chlorosilane are reacted at the temperature T1 in the reactor 1, and the generated reaction gas is introduced into the deposition vessel 4 through the transfer unit 5. The reaction gas is, for example, cooled by heat exchange at an outer wall of the feeder or an inner wall of the transfer unit, and externally cooled by a cooler (not shown) so as to deposit silicon from the reaction gas at the temperature T2 in the deposition vessel 4.

Figure 5:
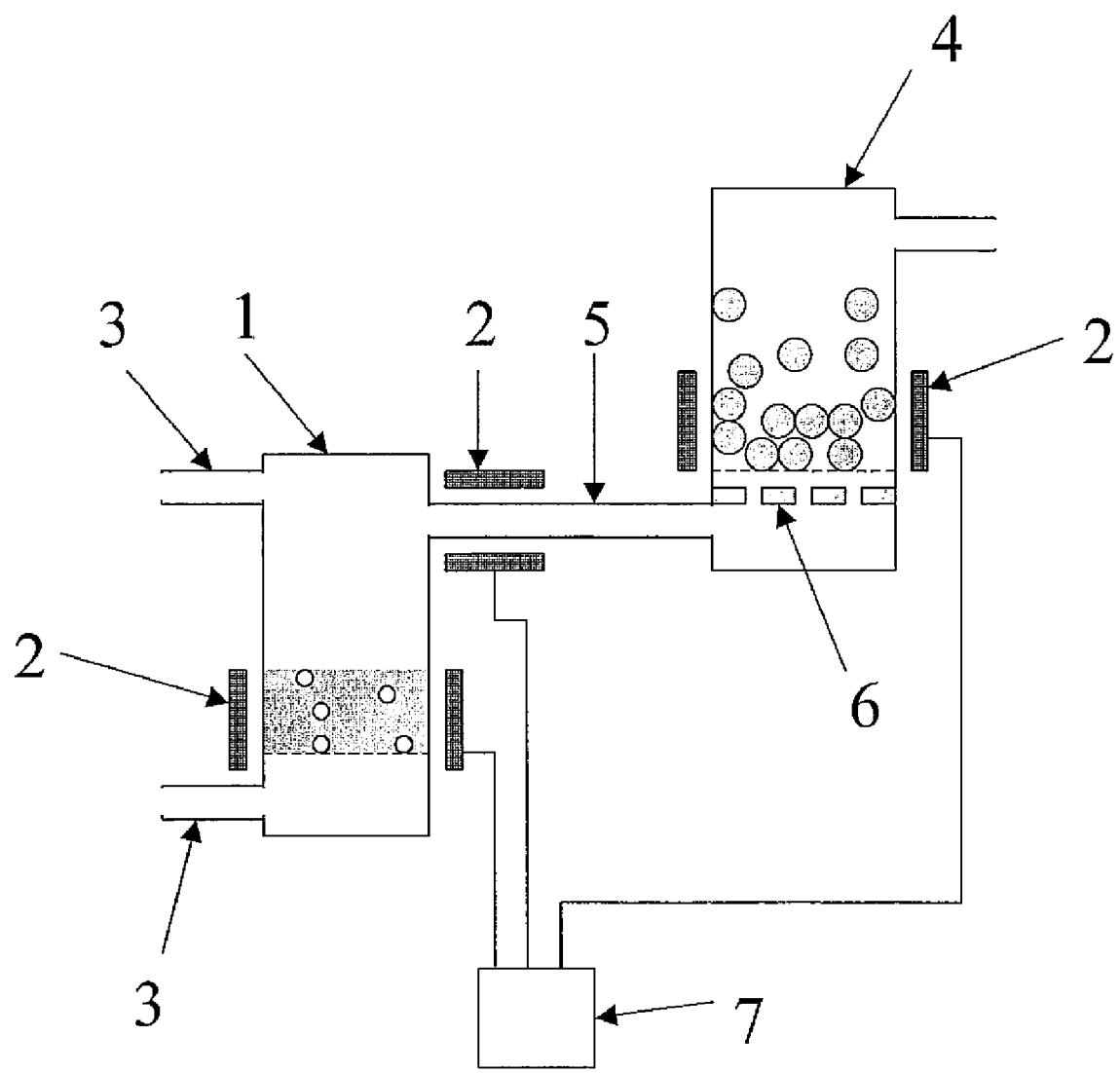
FIG. 5 shows a fifth embodiment of apparatus of the present invention.

In the apparatus shown in FIG. 5, deposition is carried out by a fluidized bed method. The apparatus has a similar structure to the apparatus shown in FIG. 1 except for a feeder 3, a deposition vessel 4, and a cooler 6. In the apparatus shown in FIG. 5, a temperature of the reaction gas from the reactor 1 is controlled in the transfer unit 5, and the reaction gas is introduced into the deposition vessel 4. The temperature of the reaction gas is decreased by cooling so as to deposit silicon on seed crystals. The feeder 3 set at an upper part of the reactor 1 controls chlorosilane content in the deposition vessel 4. In the deposition vessel 4, a seed crystal is in fluidizing state, and silicon is deposited on the seed crystal.

Figure 6:
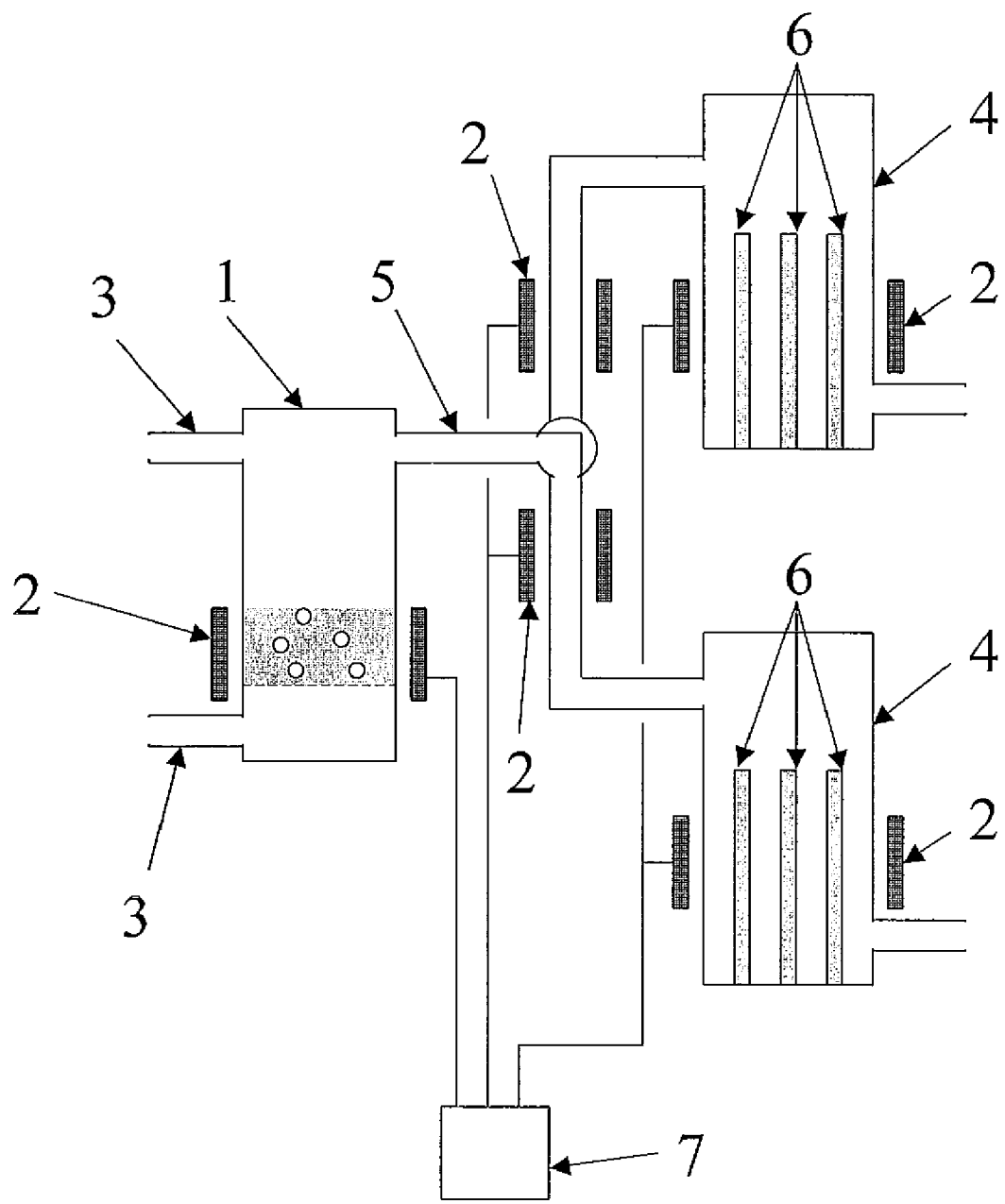
FIG. 6 shows a sixth embodiment of apparatus of the present invention.

In the apparatus shown in FIG. 6, a feeder 3, a deposition vessel 4, and a cooler 6 are added to the apparatus shown in FIG. 1. The feeder 3 set at an upper part of the reactor 1 controls chlorosilane content in the deposition vessel 4. Two deposition vessels 4 are alternately driven by a valve set at the transfer unit 5. According to the apparatus, while silicon is deposited in one deposition vessel, deposited silicon is taken out from another one. Thus, silicon is continuously produced.

EXAMPLES

The present invention will be illustrated with examples. The scope of the invention is limited by these examples. Aluminum and silicon were analyzed using a glow discharge mass spectrometric analysis (GDMS).

Example 1

Figure 7:
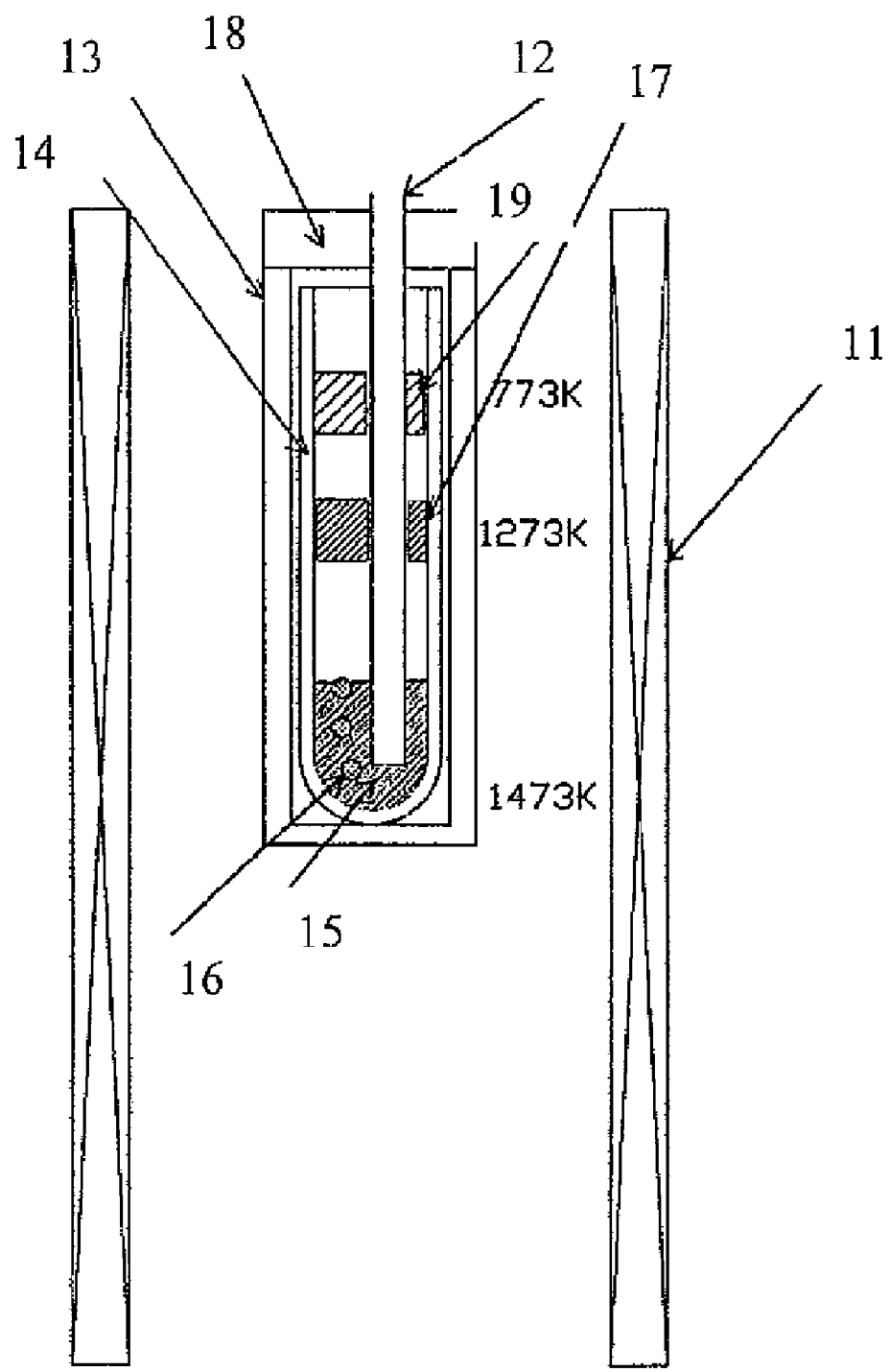
FIG. 7 is a schematic view of apparatus used in Example 1.

The apparatus shown in FIG. 7 was used.

An alumina protecting tube 14 (manufactured by NIKKATO CORPORATION, SSA-S, No. 8, inner diameter: 13 mm) including 10 g of aluminum (purity: 99.999% by weight, Fe: 0.73 ppm, Cu: 1.9 ppm, Ga: 0.57 ppm, Ti: 0.03 ppm, Ni: 0.02 ppm, Na: 0.02 ppm, Mg: 0.45 ppm, Zn: less than 0.05 ppm, B: 0.05 ppm, P: 0.27 ppm) was held in an alumina container 13, and was held in a vertical tubular furnace 11. Silicon tetrachloride gas (purity: 99.9999% by weight (6N), Fe: 5.2 ppb, Al: 0.8 ppb, Cu: 0.9 ppb, Mg: 0.8 ppb, Na: 2.4 ppb, Ca: 5.5 ppb, P: less than 1 ppm, B: less than 1 ppm, manufactured by Tri Chemical Laboratories Inc.) was introduced into molten aluminum for 4 hours at 1573K (1.68 times of the melting point of aluminum) and reacted. In order to carry out gas bubbling, the distance between a top end of a gas tube 12 (manufactured by NIKKATO CORPORATION, SSA-S, an outer diameter: 6 mm, inner diameter: 4 mm) and a bottom part of the alumina protecting tube 14 was made to be 10 mm.

Silicon tetrachloride was transferred by feeding argon gas (produced by JAPAN AIR GASES Co., purity: 99.9995%) as a carrier gas at 0.1 MPa. Argon gas of 200 SCCM (flow rate: 200 ml/min., 0° C., 101.3 kPa) as a carrier gas was introduced into a container made of stainless steel (not shown) in which silicon tetrachloride gas was filled. Vaporized gas was introduced into the alumina protecting tube 14 with the carrier gas. The feed rate of silicon tetrachloride per one minute was 0.476 g. The number of moles of the silicon tetrachloride was 0.8% with respect to the number of moles of aluminum. The container made of stainless steel was held in a thermostatic vessel at 29° C. A vapor pressure of silicon tetrachloride at this temperature was 264 mmHg. Thus, a content of silicon tetrachloride gas introduced into the alumina protecting tube 14 was 34.7% by volume.

Figure 8:
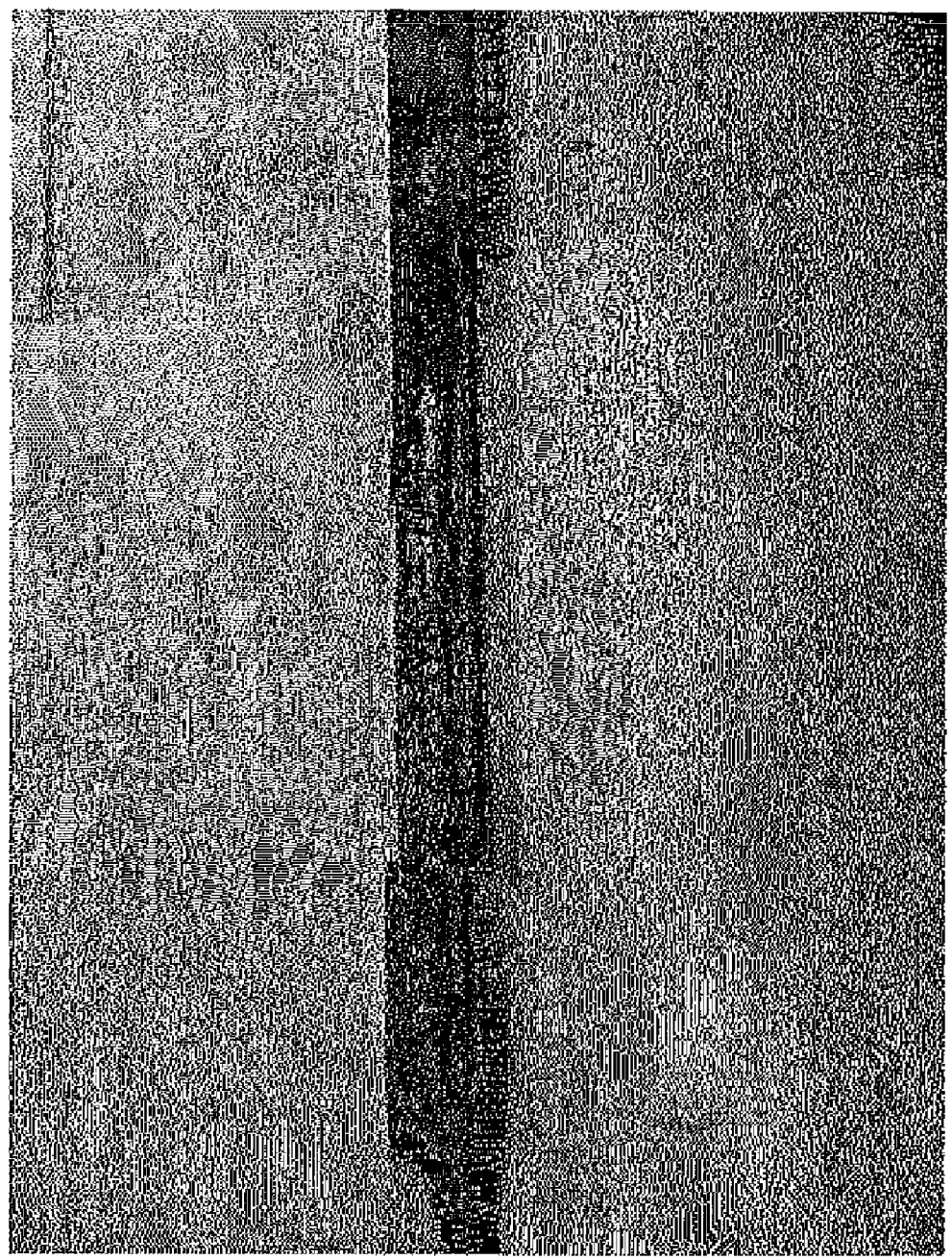
FIG. 8 is a photograph showing a silicon depositing state.

When the silicon tetrachloride gas was introduced for 4 hours, the vertical tubular furnace 11 was cooled, and the alumina protecting tube 14 was taken out. At the inner wall of the alumina protecting tube 14, silicon was deposited at a zone within a temperature zone of not more than 900° C. at heating. A photograph of silicon deposited on the outer wall of the gas tube 12 was shown in FIG. 8.

The weight of silicon deposited on the inner wall of the alumina protecting tube 14 was 3.5 g.

Example 2

The aluminum protecting tube 14 having 11 g of aluminum was held in the alumina container 13, and held in the vertical tubular reactor 1. Then, silicon tetrachloride gas was introduced for 126 minutes into molten aluminum at 1573K and reacted at an atmospheric pressure.

Argon gas of 50 SCCM (flow rate: 50 mL/min., 0° C., 101.3 kPa) as a carrier gas was introduced into a container made of stainless steel in which silicon tetrachloride gas was filled. Vaporized gas was introduced into the reactor with the carrier gas. The feed rate of silicon tetrachloride per one minute was 0.44 g. The number of moles of the silicon tetrachloride was 0.69% with respect to the number of moles of aluminum. A flow rate of a gas component contacted with aluminum to have an equal temperature at the deposition zone was 3.58 m/min. The container made of stainless steel in which silicon tetrachloride was filled was held in the thermostatic vessel at 45° C. A vapor pressure of silicon tetrachloride at 45° C. was 500 mmHg, and a content of silicon tetrachloride gas was 65.8% by volume. Except for these procedures the same procedures as Example 1 was repeated. The weight of silicon deposited on the wall of the alumina protecting tube was 2.3 g.

Example 3

Silicon tetrachloride gas was introduced into molten aluminum for 126 minutes at 1473K (1.58 times of the melting point of aluminum), and reacted. A gas flow rate at the deposition zone was 3.36 m/min. Except for this procedure the same procedures as Example 2 was repeated. The weight of silicon deposited on the wall of the alumina protecting tube was 1.2

Example 4

An apparatus was fabricated by taking a member 14A and seven members 14B into an alumina container 13A (manufactured by NIKKATO CORPORATION, SSA-S, tube, inner diameter: 22 mm), where the member 14A was obtained by cutting the alumina protecting tube 14 (produced by NIKKATO CORPORATION, SSA-S, No. 9, inner diameter: 16 mm) from the closing side of the tube 14 so as to have the length of 100 mm, and the members 14B were obtained by cutting a tube having the same diameter as that of the member 14A so as to have the length of 30 mm. After carrying out a reduction test, a temperature of the deposition zone was previously measured and the deposition amount of silicon was measured from the weight change of these tubes. 11 g of aluminum was taken into the member 14A, silicon tetrachloride gas was introduced into the molten aluminum for 33 minutes at an atmospheric pressure and 1573K (1.68 times of the melting point of aluminum), and reacted. In order to carry out gas bubbling, the distance between a top end of the gas tube 12 and a bottom part of the alumina protecting tube 14A was made to be 5 mm.

Argon gas of 94 SCCM as a carrier gas was introduced into a silicon tetrachloride gas container so as to introduce silicon tetrachloride into a reactor with the carrier gas. The feed rate of silicon tetrachloride per one minute was 0.82 g. The number of moles of the silicon tetrachloride was 1.2% with respect to the number of moles of aluminum. A flow rate of a gas contacted with aluminum to have an equal temperature at the deposition zone was 6.74 m/min.

The container made of stainless steel in which silicon tetrachloride was filled was held in a thermostatic vessel at 45° C. A vapor pressure of silicon tetrachloride at 45° C. was 500 mmHg, and thus a content of silicon tetrachloride gas was 66% by volume. The weight of silicon deposited on the wall of the alumina protecting tube and the gas tube was 1.1 g. Silicon had Fe of 1.3 ppm, Cu of less than 0.05 ppm, Al of 37 ppm, P of less than 0.01 ppm, and B of less than 0.01 ppm.

Example 5

Argon gas of 179 SCCM as a carrier gas was introduced into a silicon tetrachloride gas container for 33 minutes so as to introduce silicon tetrachloride into a reactor with the carrier gas. The feed rate of silicon tetrachloride per one minute was 1.55 g. A gas flow rate at the deposition zone was 12.78 m/min. Except for this procedure the same procedures as Example 4 was repeated.

The weight of silicon deposited on the wall of the alumina protecting tube and the gas tube was 2.2 g.

Comparative Example 1

The same procedures as Example 1 was carried out except a temperature in the vertical tubular furnace 11 was kept at 1173K (1.26 times of the melting point of aluminum), and silicon tetrachloride gas was introduced into molten aluminum at 1173K.

Silicon was not deposited on an inner wall of the alumina protecting tube 14.

Impurity elements contained in silicon may further reduced by unidirectional solidification of the silicon obtained in Examples. The obtained silicon is suitable for a material for a solar cell.

Industrial Applicability

According to the method of the present invention, high purity polycrystalline silicon is obtained with high yield because reactivity of chlorosilane and aluminum is high, and silicon reacted once is gasified as a silicon compound, and then deposited.

The invention claimed is:

1. A method for producing polycrystalline silicon comprising the steps of (A), (B), and (C),
    (A) reducing a chlorosilane represented by the formula (1) with aluminum at a temperature T1 to obtain a silicon compound and a chloride of aluminum;

$$SiH_nCl_{4-n} \quad (1)$$

wherein n is an integer of 0 to 3,
    (B) transferring the silicon compound and the chloride of the aluminum to a zone having a temperature T2, wherein T1>T2; and
    (C) depositing polycrystalline silicon in the zone having a temperature T2,
wherein the temperature T1 is not less than 1.41 times and is less than 2.33 times of a melting point expressed in Kelvin of aluminum, and the temperature T2 is not less than 1.5 times of a sublimation point or boiling point expressed in Kelvin of the chloride of aluminum.

2. The method according to claim 1, further comprising the step of (D), (D) purifying the polycrystalline silicon obtained in the step (C).

3. The method according to claim 1 or 2, wherein the chlorosilane is provided by a material that is a gas of the chlorosilane alone or a mixed gas of the chlorosilane and an inert gas.

4. The method according to claim 3, wherein the material has a chlorosilane content of not less than 10% by volume.

5. The method according to claim 1 or 2, wherein the chlorosilane is at least one selected from silicon tetrachloride, trichlorosilane, dichlorosilane, and monochlorosilane.

6. The method according to claim 1, wherein the aluminum has a purity of not less than 99.9% by weight and the purity is represented by the following formula:

Purity (% by weight)=100−(Fe+Cu+Ga+Ti+Ni+Na+Mg+Zn)

wherein Fe, Cu, Ga, Ti, Ni, Na, Mg and Zn indicate the contents (% by weight) of iron, copper, gallium, titanium, nickel, sodium, magnesium and zinc, respectively.

7. The method according to claim 1 or 2, wherein a gas flow rate in the zone at the temperature T2 is from not less than 0.62 m/min. to less than 1000 m/min.

\* \* \* \* \*